(12) United States Patent
Ranish et al.

(10) Patent No.: US 6,888,104 B1
(45) Date of Patent: May 3, 2005

(54) THERMALLY MATCHED SUPPORT RING FOR SUBSTRATE PROCESSING CHAMBER

(75) Inventors: Joseph M. Ranish, San Jose, CA (US); Aaron Muir Hunter, Santa Cruz, CA (US); Balasubramanian Ramachandran, Santa Clara, CA (US); Jallepally Ravi, Santa Clara, CA (US); Sundar Ramamurthy, Fremont, CA (US); Vedapuram S. Achutharaman, San Jose, CA (US); Khurshed Sorabji, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/773,650

(22) Filed: Feb. 5, 2004

(51) Int. Cl.[7] .................................. F27B 5/14
(52) U.S. Cl. ..................... 219/390; 219/405; 219/411; 392/416; 392/418; 118/724; 118/725; 118/50.1
(58) Field of Search .................. 219/390, 405, 219/411; 392/416, 418; 118/724, 725, 50.1

(56) References Cited

U.S. PATENT DOCUMENTS

| | | |
|---|---|---|
| 4,932,358 A | 6/1990 | Studley et al. |
| 5,618,380 A | 4/1997 | Siems et al. |
| 5,723,385 A | 3/1998 | Shen et al. |
| 5,851,299 A | 12/1998 | Cheng et al. |
| 5,929,509 A | 7/1999 | Shen et al. |
| 6,048,403 A * | 4/2000 | Deaton et al. ............... 118/725 |
| 6,133,152 A | 10/2000 | Bierman et al. |
| 6,608,287 B2 | 8/2003 | Halpin et al. |

* cited by examiner

Primary Examiner—Shawntina Fuqua
(74) Attorney, Agent, or Firm—Janah & Associates

(57) ABSTRACT

A substrate support ring has a band having an inner perimeter that at least partially surrounds a periphery of the substrate. The band has a radiation absorption surface. A lip extends radially inwardly from the inner perimeter of the band to support the substrate. The band and lip can be formed from silicon carbide, and the radiation absorption surface can be an oxidized layer of silicon carbide. In one version, the band and lip have a combined thermal mass $T_m$, and the radiation absorption surface has an absorptivity A and a surface area $S_a$, such that the ratio $(A \times S_a)/T_m$ is from about $4 \times 10^{-5}$ m$^2$K/J to about $9 \times 10^{-4}$ m$^2$K/J.

25 Claims, 3 Drawing Sheets

$R_{rs} = R_{ring} / R_{substrate}$

THERMALLY MATCHED SUPPORT RING FOR SUBSTRATE PROCESSING CHAMBER

BACKGROUND

Embodiments of the present invention relate to a support ring to support a substrate in a process chamber.

In the processing of substrates, such as semiconducting wafers and displays, the substrate is placed on a support in a process chamber and suitable processing conditions are maintained in the process chamber. For example, the substrate can be heated in a controlled heating cycle to thermally process the substrate. The substrate can be heated, for example, by an array of heating lamps disposed above or below the substrate in the chamber. Thermal processing can be used, for example, to anneal a layer that has been ion-implanted on the substrate, perform thermal oxidation or nitridation processes, or perform thermal chemical vapor deposition processes on the substrate.

However, variations in temperature gradients across the substrate can result in non-uniform processing of the substrate. Non-uniform temperatures occur at different substrate regions because of, for example, non-uniform convection or conduction heat losses from regions of the substrate in contact with the support or other chamber components and substrate regions not in contact with the support. It is particularly difficult to achieve temperature uniformity across the substrate when the substrate is heated at rapid heating rates, such as in rapid thermal processing (RTP) systems. Thus, it is generally desirable to maintain uniform temperatures across the substrate during thermal processing to provide uniform processing results.

The temperature gradients in the substrate have been reduced using a substrate support ring that extends outwardly from the substrate to surround a periphery of the substrate. The ring effectively expands or pushes out the temperature gradients in the substrate from the substrate periphery to the outer edges of the ring. The support can also have a top surface made of a material that has heat absorption properties similar to that of the substrate to further equalize temperatures between the substrate center and periphery. For example, a support ring comprising silicon carbide coated with silicon is described in U.S. Pat. No. 6,280,183 to Mayur et al, and U.S. Pat. No. 6,200,388 to Jennings, both assigned to Applied Materials, and both of which are herein incorporated by reference in their entireties.

However, even such support rings can fail to provide adequate temperature uniformity across the substrate in rapid heating rate processes, for example, processes having heating rates of at least about 200° C./second. In these processes, the difference in heating rates between the support ring and the substrate generates temperature gradients along the periphery of the substrate that become unacceptably high during the heating process step. For example, use of a conventional ring in a rapid heating rate process can cause temperatures across the substrate to vary by at least about 15° C., which is excessively high.

Accordingly, it is desirable to have a support ring that does not generate excessive temperature gradients in a substrate during thermal processing. It is also desirable to have a support ring that heats at a rate that is sufficiently close to the heating rate of the substrate to reduce the formation of temperature gradients in the substrate.

SUMMARY

In one embodiment, a substrate support ring has a band having an inner perimeter that at least partially surrounds a periphery of the substrate. The band has a radiation absorption surface. A lip extends radially inwardly from the inner perimeter of the band to support the substrate. The band and lip can be formed from silicon carbide, and the radiation absorption surface can be an oxidized layer of silicon carbide.

In another embodiment of the support ring, the band and lip have a combined thermal mass $T_m$, and the radiation absorption surface has an absorptivity $A$ and a surface area $S_a$, such that the ratio $(A \times S_a)/T_m$ is from about $4 \times 10^{-5}$ m²K/J to about $9 \times 10^{-4}$ m²K/J.

In one embodiment, a substrate support ring to support a substrate in a process chamber is fabricated. The substrate has a thermal mass $T_{ms}$, and a top surface having an absorptivity $A_s$, and a surface area $S_{as}$. The substrate has a substrate heating rate value of $(A_s \times S_{as})/T_{ms}$. To fabricate the support ring, a band having an inner perimeter that at least partially surrounds a periphery of the substrate is formed. A lip extending radially inwardly from the inner perimeter of the band, is also formed. The band and lip have a combined thermal mass $T_{mr}$ and a support ring heating rate value comprising $(A_r \times S_{ar})/T_{mr}$. A radiation absorption surface is also formed on the band. The radiation absorption surface has an absorptivity $A_r$ and surface area $S_{ar}$, such that the ratio of the support ring heating value to the substrate heating rate value is within a predetermined range.

DRAWINGS

These features, aspects, and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1:
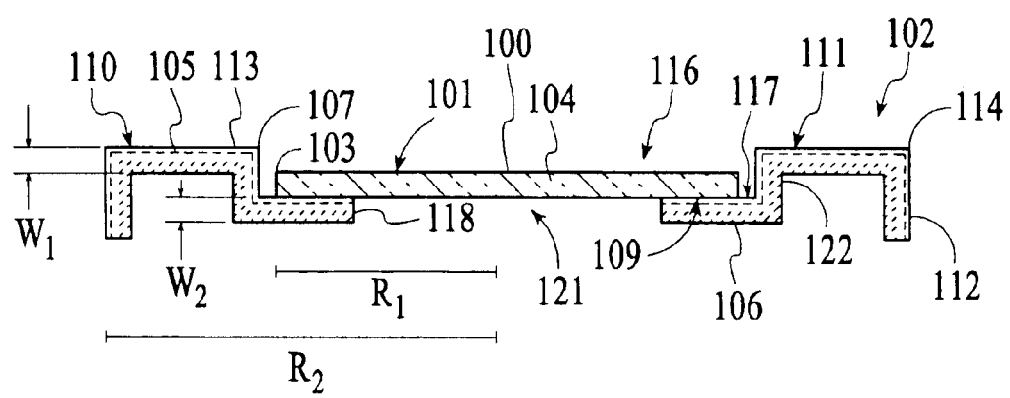
FIG. 1 is a sectional side view of an embodiment of a substrate support ring.

Embodiments of the invention relate to a support ring 102 to support a substrate 104 during processing in a process chamber 206. The support ring 102 comprises an outer band 105 and an inner lip 106 that cooperate to support the substrate 104 during processing, as shown in FIG. 1. The band 105 and lip 106 can comprise substantially annular shapes. The outer band 105 comprises an inner perimeter 107 that at least partially surrounds a periphery 103 of the substrate 104. The band 105 serves to effectively extend the heating diameter of the substrate 104 to reduce the formation of temperature gradients in the substrate 104.

The inner lip 106 of the ring 102 extends radially inwardly from the inner perimeter 107 of the band 105 to form a supporting ledge to support the substrate 104. A substrate support surface 109 of the inner lip 106 is below the top surface 110 of the outer band 105 to form a recess 116 that holds the substrate 104 within the perimeter 107 of the band 105. The lip 106 is sized according to the size of the substrate 104, for example, the lip 106 can extend a sufficient distance beneath the substrate 104, such as from about 0.1 cm to about 0.5 cm. In the version shown in FIG. 1, an inner perimeter 118 of the lip 106 defines an open region 121 that extends across at least about 75% of the area of the substrate 104.

The support ring 102 can further comprise an annular supporting sidewall 112 that holds the ring 102 on an underlying structure, such as an underlying support cylinder 209. In the version shown in FIGS. 1 and 2, the supporting sidewall 112 extends downwardly at an outer perimeter 114 of the band 105 to support the ring 102 on the cylinder 209. The support ring 104 can also comprise an annular connector sidewall 122 that extends downwardly from the inner perimeter 107 of the band 105 to connect the band 105 to the lip 106. Alternatively, the lip 106 may be directly attached to the band 105.

The support ring 102 comprises a radiation absorption surface 111 that absorbs energy directed onto the surface 111 of the support ring 102. The radiation absorption surface 111 is provided to reduce temperature gradients arising from temperature differences between the ring 102 and the substrate 104 at the periphery 103 of the substrate 104. The absorption surface 111 comprises a portion of a top surface of the support ring 102 that is exposed to a radiation source 210. For example, the absorption surface 111 can be a portion of the top surface 110 of the band 105, and can even comprise the entire top surface 110 of the band 105. The absorption surface 111 can also comprise an exposed surface portion 117 of the inner lip surface 109 that is between the periphery 103 of the substrate 104 and an inner perimeter 107 of the band 105.

The properties of the absorption surface 111 are selected relative to the thermal mass ($T_m$) of the support ring 102 to improve processing. For example, it has been found that good heating results are provided with a ratio (R) of the absorptivity (A) of the absorption surface 111 multiplied by the surface area ($S_a$) of the absorption surface 111 to the thermal mass ($T_m$) that is within a predetermined range. The formula for the ratio (R) is shown in equation (1) below.

$$R=(A \times S_a)/T_m \qquad 1).$$

In one version, the ratio (R) is from about $4\times10^{-5}$ m²K/J to about $9\times10^{-4}$ m²K/J. For example, the ratio (R) can be from about $5.7\times10^{-5}$ m²K/J to about $8.8\times10^{-4}$ m²K/J to process a substrate 104 having a diameter of about 200 mm, and from about $5.2\times10^{-5}$ m²K/J to about $8.1\times10^{-4}$ m²K/J to process a substrate 104 having a diameter of about 300 mm. Substrates processed with a support ring 102 having the desired ratio exhibit reduced temperature gradients on the substrate 104, such as a range in temperatures across the substrate of less than about 2° C., which is a range that is small enough to be controlled via modulation of the radiation source 210.

To determine the ratio (R) of the support ring 102, the absorptivity of the absorption surface 111 of the support ring 102 is measured. The absorptivity is a measure of the fraction of radiation incident on a surface that is absorbed by the surface, as opposed to being reflected by or transmitted through the surface. The absorptivity of a surface is depends upon the composition and reflectivity of the surface, and thus surfaces having different compositions will typically have varying absorptivity values. For example, a surface comprising silicon carbide typically absorbs a different fraction of incident radiation, and thus has a different absorptivity than a surface comprising silicon oxide. Various spectrophotometric techniques can be used to measure the absorptivity, such as for example partial hemispherical reflectivity measurements, complete hemispherical measurements, partial hemispherical emissivity measurements and complete hemispherical emissivity measurements, as known to those of ordinary skill in the art. The absorptivity can be measured for a given wavelength of incident radiation, or over a range of wavelengths, for example, a range of from about 0.2 microns to about 5 microns.

In one version, the absorptivity is measured by detecting a partial hemispherical reflectivity of the irradiated surface, which is a partially spatially averaged measure of the radiation reflected from the surface, an example of which measurement is described in U.S. Patent Application No 2003/0027364 to Ikeda, assigned to Hitachi Kokusai Electric Inc, which is herein incorporated by reference in its entirety. In this version, the support ring 102 is placed in a measurement chamber and radiation is directed onto the absorption surface 111 of the support ring 102. A property of the radiation that is reflected from the surface of the support ring 102 or substrate 104 is detected. For example, the intensity of the reflected radiation at one or more wavelengths can be detected, such as the intensity at wavelengths of from about 0.2 microns to about 5 microns. The support ring 102 may also be rotated while detecting the reflected radiation to provide a spatially averaged measure of the reflected radiation. While a full hemispherical reflectivity measurement that represents the spatially averaged value of the radiation reflected from the surface 111 in all directions could be obtained, a partial hemispherical measurement that is averaged over only a portion of the reflected radiation can also be used. For example, in one version, the detected reflected radiation is the radiation reflected from the irradiated surface in a 90 degree cone centered about a vector that is normal to the surface.

The absorptivity can be determined from reflectivity measurements according to the following relationship:

$$A+r+t=1 \qquad 2)$$

where the absorptivity (A) is the fraction of the incident radiation absorbed by the surface, the reflectivity (r), is the fraction of the incident radiation reflected by the surface, and the transmissivity (t) is the fraction of incident radiation that passes through the object, which is close to zero for the support ring 104 and substrate 102. The reflectivity is equal to the detected intensity of radiation reflected from the surface divided by the intensity of the radiation incident on the surface. Accordingly, the absorptivity of a surface can be determined by inserting the value of the reflectivity obtained by detecting the reflected radiation into equation (2) above. Thus, the partial hemispherical reflectivity measurement provides for the determination of the absorptivity of the irradiated absorption surface 111 of the support ring 102, from which the ratio (R) in equation (1) can be determined.

The thermal mass $T_m$ in equation (1) of the support ring 102 is the heat capacity (C) of the material from which the object is made, multiplied by the mass (m) of the ring 102 to give a measure of the overall heat capacity of the entire support ring 102. The heat capacity of a material is the quantity of heat required to raise the temperature of a unit of mass of the material by a unit change in temperature. Thus, the heat capacity is the proportionality constant that relates the change in temperature of the object to the amount of heat transferred to or from the object, as shown in equation 3:

$$q=mC\Delta T \qquad 3)$$

where q is the heat transferred to or from the object, m is the mass of the object, and $\Delta T$ is the change in temperature of the object resulting from the transfer of heat (q). The heat capacity can be determined from look-up tables or calorimetric measurements. Furthermore, as the heat capacity of a material can vary over a range of temperatures, the heat capacity used in equation (1) can be taken to be the average of the heat capacities of the material over a temperature range of interest, such as a temperature range that occurs during processing of the substrate 104. In one version, the heat capacity of the support ring 102 is taken as the average of the heat capacities of the ring 102 over the temperature range used in a thermal spike annealing process, such as a temperature range of from about 100° C. to about 1350° C., and even from about 550° C. to about 1050° C. The mass of the support ring 102 can be determined by weighing the support ring 102, or by determining the volume of the support ring 102 and multiplying the volume by the density of the material of which the support ring 102 is made.

The surface area of the support ring surface irradiated by the radiation source is the final quantity that is determined to find the ratio (R) of the support ring 102 according to equation (1). The irradiated surface area of the support ring 102 is the area of the absorption surface 111, which may include the area of the upper surface 110 of the support ring band 105, and may also include the area of an exposed surface portion 117 at the periphery 103 of the substrate 104 on the support ring lip 106. For example, the surface area of the support ring absorption surface 111 can be determined according to the equation $(\pi(R_2)^2-\pi(R_1)^2)$, where $R_1$ is the radius of the substrate 104 and $R_2$ is the radius of the outer perimeter 114 of the band 105.

In one version, a support ring 102 having a desired ratio (R) can be devised by selecting characteristics of the support ring, such as the radiation absorption surface 111, that give a ratio (R) within the predetermined range. For example, to provide a higher ratio (R), a support ring 104 can be fabricated with an absorption surface 111 comprising a material with a higher absorptivity that absorbs a greater fraction of the incident radiation. A coating can also be provided that has a higher absorptivity. The surface area of the irradiated surface can also be increased to provide a larger area over which incident radiation is absorbed, for example, by increasing the geometric size of the surface, and also by increasing the surface roughness. Conversely, providing an absorption surface having a lower absorptivity, or decreasing the irradiated surface area would decrease the ratio (R) of the support ring 102. In another method of decreasing the ratio (R) of the support ring 102, the thermal mass of the support ring 102 can be increased, for example by fabricating the support ring from a material having a higher heat capacity. The thermal mass of the support ring 102 can also be increased by increasing the mass of the ring 102, for example by increasing the dimensions of the support ring 102 or by fabricating the support ring 102 from a material that has a higher density. Conversely, selecting a support ring material having a lower heat capacity, reducing the mass of the support ring 102 by reducing the dimensions of the ring 102, or selecting a less dense ring material will decrease the thermal mass of the support ring 102, and increase the ratio of the support ring 102.

In one version, a support ring 102 having the desired ratio (R) comprises a silicon carbide material having an integral surface coating 113 comprising oxidized silicon carbide. The integral surface coating 113 forms a unitary and continuous structure with the ring 102 that is absent a discrete and sharp crystalline boundary therebetween, as schematically illustrated in FIG. 1 with a dotted line. The absorption surface 111 comprises a portion of the upper surface of the integral surface coating 113. In one version, the integral surface coating 113 is formed in-situ from the surface of the ring 102 by "growing" the integral surface coating 113 out of the underlying ring 102. The integral surface coating 113 is more strongly bonded to the underlying ring material than conventional coatings, such as thermally sprayed coatings, which have a discrete interface with the underlying ring structure. The integral surface coating 113 comprising the oxidized species may comprise a thickness of from about 1 nm to about 5000 nm. As an example, the oxidized coating can be a layer of oxidized silicon carbide.

In one version, the support ring 102 comprises a sintered material comprising a composition of silicon carbide and nitrogen, with a surface coating 113 comprising oxidized species. The sintered silicon carbide and nitrogen material can be formed by mixing a silicon carbide powder with a source of nitrogen, such as a polyimide resin or amine compound, and an auxiliary sintering agent. The mixture is then placed in a mold having a desired shape and heated under pressure in an inert atmosphere to a suitable sintering temperature, such as a sintering temperature of from about 2,000° C. to about 2,400° C. at a pressure of from about 300 to 700 kgf/cm$^2$, to yield the sintered product. Various pre-treatment steps can also be performed to remove impurities from the mixture, for example by pre-heating the mixture before sintering. The sintered material desirably has a density of from about 2.5 to about 3.2 g/cm$^3$. The sintered material also desirably has nitrogen content that is sufficiently high to render the material substantially opaque to the incident radiation, such as radiation in the range of from about 0.2 microns to about 5 microns. A desirable nitrogen content may be at least about 1 ppm, such as from about 1 ppm to about 150,000 ppm. The sintered material can be machined to a desired shape, such as the support ring shape shown in FIG. 1. To form the integral surface coating 113 having the oxidized species, the sintered material can be placed in a furnace and heated in an oxygen-containing environment to oxidize silicon-containing species at the surface of the material, thus forming an integral surface coating 113 comprising an oxidized layer of silicon carbide. For example, the sintered material can be heated to a temperature of at least about 1000° C. in an $O_2$-containing atmosphere.

The support ring 102 comprising the sintered silicon carbide material containing nitrogen and having the integral surface coating 113 comprising the oxidized layer is desirably manufactured to provide a ratio (R) in the predetermined range. The support ring 102 comprising the sintered material has an absorption surface 111 having an absorptivity value of from about 0.1 to about 1.0, and even from about 0.8 to about 1, such as about 0.94, as measured by a partial hemispherical reflectivity method. The heat capacity (C) of the sintered material is from about 900 J/Kg/K to about 1300 J/Kg/K, such as about 1130 J/Kg/K, as averaged over the temperature range of from about 550° C. to about 1050° C. The irradiated surface area (S) is from about $2\times10^{-3}$ m$^2$ to about $3\times10^{-2}$ m$^2$, such as about $1.4\times10^{-2}$ m$^2$.

The dimensions of the support ring 102 are selected to provide a suitable thermal mass ($T_m$). For example, the dimensions can be selected to provide a mass equivalent to a mass of from about 4 g to about 40 g, such as about 20 g to process a substrate having a diameter of 300 mm and a substrate absorptivity of about 0.95, giving a thermal mass ($T_m$) of from about 2 J/K to about 750 J/K. For example, the thermal mass can be equivalent to a thermal mass of from about 3 J/K to about 45 J/K, for an irradiated ring surface area of from about $2\times10^{-3}$ m$^2$ to about $3\times10^{-2}$ m$^2$, to process a substrate having a diameter of about 300 mm and an absorptivity of about 1.0. As another example, the thermal mass can be equivalent to a thermal mass of from about 30 J/K to about 450 J/K, for an irradiated ring surface area of from about $3\times10^{-3}$ m$^2$ to about $3\times10^{-2}$ m$^2$, to process a substrate having a diameter of about 300 mm and an absorptivity of about 0.1. In one version, the thermal mass of the support ring 102 is from about 4 J/K to about 44 J/K, such as about 23 J/K. The dimensions can be selected by, for example, increasing or decreasing the thickness of one or more of the support ring band 105 and lip 106. For example, a suitable thickness ($w_1$) of the band 105 may be a thickness equivalent to a thickness of from about $2.3\times10^{-4}$ m to about $2.8\times10^{-4}$ m, such as about $2.5\times10^{-4}$ m, and a suitable thickness ($w_2$) of the lip 106 may be a thickness equivalent to a thickness of from about $1.8\times10^{-4}$ m to about $2.3\times10^{-4}$ m, such as about $2.0\times10^{-4}$ m, to process a substrate 104 having a diameter of about 300 mm. The diameter of the band 105 or lip 106, as well as the dimensions of the supporting sidewall 112 and connector sidewall 122, can also be changed to provide a desired mass. Furthermore, it has been discovered that maintaining a ratio of the band thickness ($w_1$) to the lip thickness ($w_2$) from about 1.14 to about 1.3 may be desirable to provide a good distribution of mass in the support ring 102 and reduce temperature gradients in the substrate 104. In one version, characteristics of the support ring 102 comprising the sintered material comprising silicon carbide and nitrogen and having the integral surface coating 113 having oxidized species are selected to provide a ratio (R) of from about $5.2\text{E}10^{-4}$ to about $7.6\times10^{-4}$ m$^2$K/J, such as about $6.4\times10^{-4}$ m$^2$K/J.

It is believed that the improved substrate processing results given by the support ring 102 having the ratio (R) in the predetermined range may be due to "thermal matching" of the support ring 102 having the ratio to the substrate 104 being processed. For such a "thermally matched" support ring 102, the temperatures of the support ring 102 and substrate 104 change by substantially the same amount per unit of time during substrate processing, thereby ensuring that the temperatures of the support ring 102 and substrate 104 remain substantially matched throughout the process. This thermal matching is important, because a hotter or colder support ring 102 can exchange heat with the edge of the substrate 104, thus generating temperature gradients along the substrate 104 that can adversely affect the uniformity of the process results. For a support ring 102 having a "matched" heating rate, the temperature gradient effects at the edge of the substrate are reduced, thereby improving the process uniformity of the substrates and the overall yield. Desirably, the support ring characteristics are selected to provide a rate of heating of the support ring 102 that is within a predetermined range of a substrate heating rate, such as a support ring heating rate that is from about 105% to about 130% of the substrate heating rate.

It has been unexpectedly discovered that a good measure of the relative heating rates of the support ring 102 and substrate 104 can be obtained by comparing the ratio (R) of the support ring 102, to a ratio (R) for the substrate 104. The ratio (R) for the substrate 104 is determined according to equation (1). The substrate ratio (R) comprises the absorptivity (A) of the top surface 101 of the substrate 102 times the surface area ($S_a$) of the top surface 101, divided by the thermal mass ($T_m$). The absorptivity and thermal mass of the substrate 104 can be determined according to the techniques described for the support ring 104 above, and the surface area of the substrate 104 is equal to $\pi(R_1)^2$, where $R_1$ is the radius of the substrate 104. It is believed that the ratio (R) is an approximate measure of the true heating rate of the support ring 102 and substrate 104, and takes into account factors that have a large effect on the rate of heating of the ring 102 and substrate 104. Thus, a support ring can be devised that has a good relative heating rate with respect to a substrate 104 to be processed. For example, a support ring 102 may be provided that has a ring ratio ($R_r$) within from about 5% to about 30% of the substrate ratio ($R_s$). Also, as the ratio (R) is typically an approximate measure of the exact heating rate, the desired heating rate ratio ($R_r$) of the support ring 102 can be other than the heating rate ratio ($R_s$) of the substrate 104. In one version, a desired relative heating rate ($R_{rs}$) of the support ring 102 to the substrate 104 may be determined by taking a ratio of the support ring heating rate ratio ($R_r$) to the substrate heating rate ratio ($R_s$), and determining whether the ratio lies within a predetermined range. For example, a desired relative heating rate ratio ($R_{rs}=R_r/R_s$) of the support ring 102 with respect to the substrate 104 may be from about 1.05 to about 1.30, such as about 1.10 to about 1.20, and even from about 1.12 to about 1.15, such as about 1.14.

The discovery that a comparison of the ratios $R_r$ and $R_s$ of the support ring 102 and substrate 104 could provide a good estimate of the relative heating rate was unexpected, because it was believed that a number of complicated heat transfer mechanisms between the substrate, support ring and chamber environment had to be evaluated to provide a useful measure of the heating rates. For example, a complete heat transfer model would require modeling of not only the conductive heat exchange between the support ring 102 and substrate 104, which is itself very complex, but also modeling of the conductive heat exchange between the support ring 102 and other portions of the chamber, such as an underlying support cylinder. Such a complete model would also require determining the extent of thermal coupling between the substrate or support ring and surrounding components such as the chamber walls, and even modeling of the radiative heat exchange occurring between the substrate and a reflective plate in the open region beneath the substrate, as well as any other sources of heat exchange. Also, convective losses of heat to the chamber environment would have to be modeled, which can be especially difficult to calculated for a rotatable support, such as that used in the thermal process chamber of FIG. 2. However, despite the complicated nature of the heat transfer process, Applicants have discovered that comparing the heating ratios $R_r$ and $R_s$ provides a good measure of the relative heating rate of the support ring 102 to the substrate 104 for the purpose of fabricating a thermally matched support ring 102 and substrate 104, without requiring intensive and complicated calculations.

Figure 2:
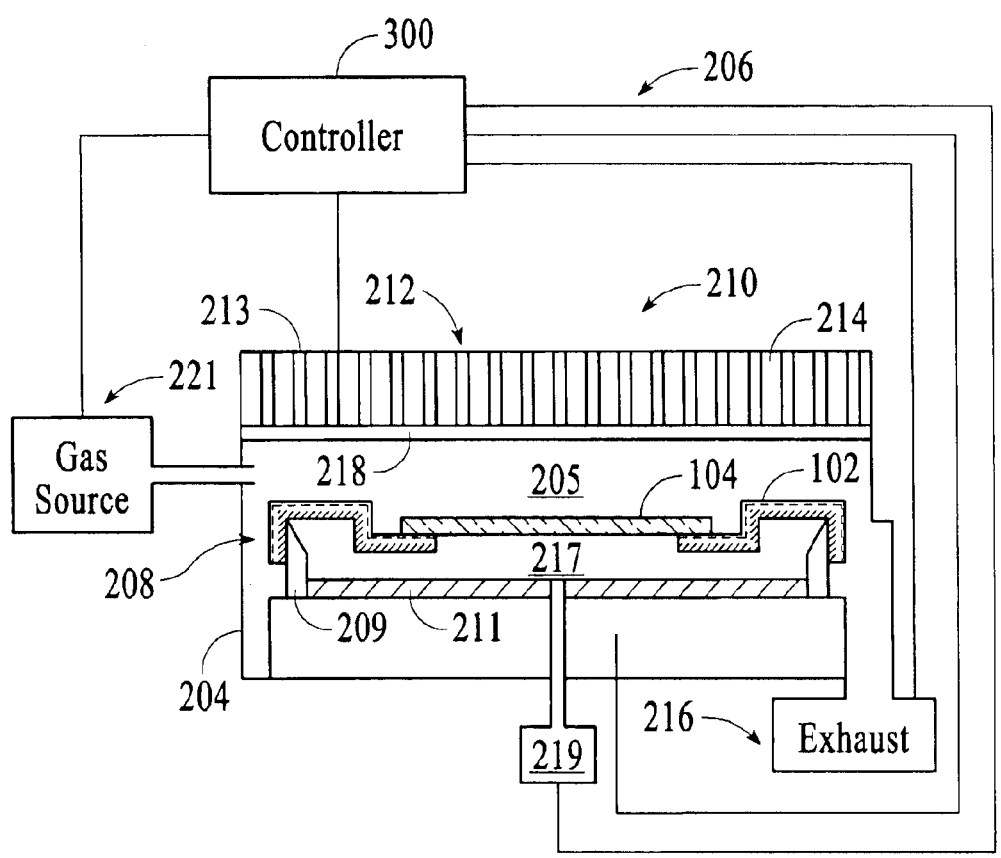
FIG. 2 is a sectional side view of an embodiment of a thermal processing chamber having the support ring.

The support ring 102 having the predetermined ratio (R) can be provided in a process chamber 206 such as a rapid thermal process chamber 206, an embodiment of which is shown in FIG. 2. The rapid thermal process chamber 206 is capable of providing a controlled thermal cycle that heats the substrate 104 for processes such as, for example, thermal annealing, thermal cleaning, thermal chemical vapor deposition, thermal oxidation and thermal nitridation, as described for example in U.S. Pat. No. 6,200,388 to Jennings, and U.S. Pat. No. 6,048,403 to Deaton et al, both of which are assigned to Applied Materials, Inc, and are herein incorporated by reference in their entireties. The process chamber 206 comprises chamber walls 204 enclosing a process zone 205. A substrate support 208 having the support ring 102 holds substrates 104 during processing in the process zone 205. The substrate support 208 can comprise a rotatable structure that rotates the support ring 102 and substrate 104 during processing. For example, the support 208 can comprise a quartz support cylinder 209 supporting the ring 102 that is rotated by magnetically levitating and rotating the cylinder, as described for example in U.S. Patent Application No. 2003/0183611 to Gregor et al, commonly assigned to Applied Materials, which is herein incorporated by reference in its entirety. The support 208 can further comprise a reflective plate 211 positioned below the substrate 104 that forms a reflective cavity 217. One or more temperature sensors 219, such as pyrometers having fiber optic probes, can also be provided to detect the temperature of the substrate 104 during processing.

A radiation source 210 directs radiation onto the surfaces of the substrate 104 and support ring 102, and can be positioned above the substrate 104, such as in a ceiling 213 of the chamber 206. The radiation source 210 generates radiation at wavelengths that heat the substrate 104 and support ring 102, such as radiation having wavelengths of from about 0.2 microns to about 5 microns. In one version, the radiation source 210 comprises a honeycomb array 212 of tungsten halogen lamps 214 in a fluid-cooled jacket. The array 212 can comprise one or more radial heating zones that can be independently modulated to control temperatures across the substrate 104. The radiation source 210 is capable of rapidly heating the substrate 104 for thermal processing, for example at a rate of from about 50° C./s to about 300° C./s, and even at least to about 200° C./s. A radiation-permeable window 218, such as a quartz window, facilitates the transfer of radiation from the radiation source 210 to the substrate 104.

A gas supply 221 can provide a process gas into the process zone 205 and/or control the atmosphere in the process chamber. The gas supply 221 comprises a source of process gas and a conduit having a flow control valve that connects the source to a gas inlet in the process chamber 206 to provide gas in the chamber 206. An exhaust 216 controls the pressure of gas in the process chamber 206 and exhausts process gas from the chamber 206. The exhaust 216 can comprise one or more exhaust ports that receive spent process gas and pass the spent gas to an exhaust conduit that feeds one or more exhaust pumps. A throttle valve in the exhaust conduit controls the pressure of the gas in the chamber 206.

The chamber 206 is controlled by a controller 300 that comprises program code having instruction sets to operate components of the chamber 206 to maintain conditions in the chamber suitable for the processing substrates 104. For example, the controller 300 can comprise a substrate positioning instruction set to operate one or more of the substrate support 208 and substrate transport (not shown) to position and rotate a substrate 104 in the chamber 206; a temperature control instruction set to operate the radiation source 210 to control heating of the substrate 104, and operate the temperature sensors 219 to monitor the temperature of the substrate 104; a gas flow control instruction set to operate the flow control valve to set a flow of gas to the chamber 206; and a gas pressure control instruction set to operate the exhaust throttle valve to maintain a pressure in the chamber 206.

EXAMPLE

The following example demonstrates the improved process performance of support rings 102 having a desired predetermined ratio (R). In the example, support rings 102 having different characteristics, such as different compositions and dimensions, were used to process substrates in a thermal spike annealing process performed in a thermal process chamber, such as the process chamber 206 shown in FIG. 2. The temperatures arising along different radii of each substrate 104 during processing of the substrate 104 with the support ring 102 were measured. The ratio ($R_r$) of each support ring 104 was compared to the ratio ($R_s$) of each substrate 104 to determine a relative heating rate ratio $R_{rs}=R_{ring}/R_{substrate}$. Table 1 gives the results obtained for each support ring 102.

The substrates 104 processed with the support rings 102 comprised silicon wafers having a diameter of 300 mm that were ion implanted in a conventional ion implantation process. The substrates comprised a top surface 101 having an absorptivity of 0.67 and had a thermal mass per irradiated surface area of 1715 J/Km². To process the substrates 104, a rapid thermal spike annealing process was performed that comprised rapidly heating the substrates 104 to anneal the ion implanted portions of the substrates 104. In the process, each substrate 104 was placed on one of the support rings 102 listed in Table 1 below in the process chamber 206. The temperature of the substrate 104 was then increased in a temperature spike at a rate of about 250° C./s until a final temperature of about 1050° C. was achieved.

To determine the difference in temperatures arising across the surface 101 of each substrate 104 during processing, the electrical resistance of the annealed substrate 104 was measured in a 4-point resistance contour map along the surface 101 of the substrate 104. The measured electrical resistance was converted to temperature according to a previously determined process sensitivity relationship. The difference in the average temperature at a radius of 147 mm from the center 100 of each substrate 104 was subtracted from the average temperature at a radius of 137 mm to determine the temperature range (ΔT) per substrate. The measured temperature ranges are reported for each substrate in Table 1. A positive value of the temperature range indicates a higher temperature at the periphery 103 of the substrate 104.

The support rings 102 tested in the example included support rings having different compositions and dimensions. Support ring number 1 comprised a conventional support ring 102 comprising a silicon carbide material substantially absent nitrogen that was formed by a chemical vapor deposition process and then coated with a layer of silicon having an oxidized surface. Support ring number 2 comprised a silicon carbide material containing nitrogen and coated with a layer of silicon without an oxidized surface. Support ring numbers 3 and 9 comprised sintered silicon carbide material containing nitrogen and having an unoxidized surface. Support rings 4 through 8 comprised sintered silicon carbide material containing nitrogen and having an integral surface coating 113 comprising oxidized species. The dimensions of the support rings 102 were varied with respect to one another to provide different masses and thus different heating rate ratios (R). In support ring number 5, the dimensions were changed with respect to support ring number 4 by distributing extra mass uniformly to both the band 105 and lip 106, and thereby providing a more uniform radial dimension change. In support ring numbers 6 through 9, the dimensions were changed with respect to support ring number 4 by changing a thickness of the band 105 only, while keeping the thickness of the lip 106 the same.

Table 1 lists values and results for each support ring tested, including the thickness of the band 105 and lip 106, the absorptivity (A) of the absorption surface 111, the thermal mass per irradiated area ($T_m/S_a$) of each support ring 102, the relative heating rate ($R_{rs}$) of the support ring 104 with respect to the substrate 102, and the range in temperatures across the substrate 104 measured after processing with each support ring 102. The absorptivities of the support rings 102 and substrate 104 were determined from partial hemispheric reflectivity measurements, and the heat capacities for each ring were taken to be the average over the process range of from 550° C. to 1050° C.

TABLE 1

| Support ring | Band Thickness (mils) | Lip Thickness (mils) | A | $T_m/S_a$ (J/K/m$^2$) | $R_{ring}/R_{substrate}$ | ΔT (K) |
| --- | --- | --- | --- | --- | --- | --- |
| 1 | 13 + 8 | 10 | 0.93 | 2360 | 1.01 | −5.0 |
| 2 | 13 | 10 | 0.79 | 1756 | 1.14 | −1.2 |
| 3 | 13 | 10 | 0.87 | 1756 | 1.27 | 5.0 |
| 4 | 13 | 10 | 0.94 | 1756 | 1.38 | 8.4 |
| 5 | 15.8 | 14 | 0.94 | 2068 | 1.16 | 1.5 |
| 6 | 15.7 | 10 | 0.94 | 1967 | 1.22 | 7.5 |
| 7 | 17.1 | 10 | 0.94 | 2083 | 1.16 | 6.0 |
| 8 | 27.8 | 10 | 0.94 | 2846 | 0.85 | −11.6 |
| 9 | 13.9 | 10 | 0.88 | 1830 | 1.23 | 5.1 |

According to Table 1, the smallest range in substrate temperatures was obtained for support ring numbers 2 and 5, with the range in temperatures being −1.2 and 1.5 K, respectively. In general use, however, support ring number 2, which comprised an unoxidized silicon coating, is not expected to provide consistently good processing results as the surface of the coating will slowly oxidize over time, changing the absorptivity and heating rate of the ring 102. This would limit its use to oxidant-free processes. While support ring number 4 had the same dimensions as support ring number 2, the oxidized surface of ring number 4 had a greater absorptivity, thus giving a higher relative heating rate and poorer temperature range results. Support rings numbers 6 through 8 did not provide as good of temperature range results, with temperature ranges of 6, 7.5 and −11.6 K. Support ring number 5, comprising the sintered silicon carbide material containing nitrogen and having an oxidized surface, and having the listed dimensions, provides a relative heating rate with respect to the substrate 104 that provides improved processing results, including a reduced range in temperatures across the substrate 104 of only about 1.5 K.

Figure 3:
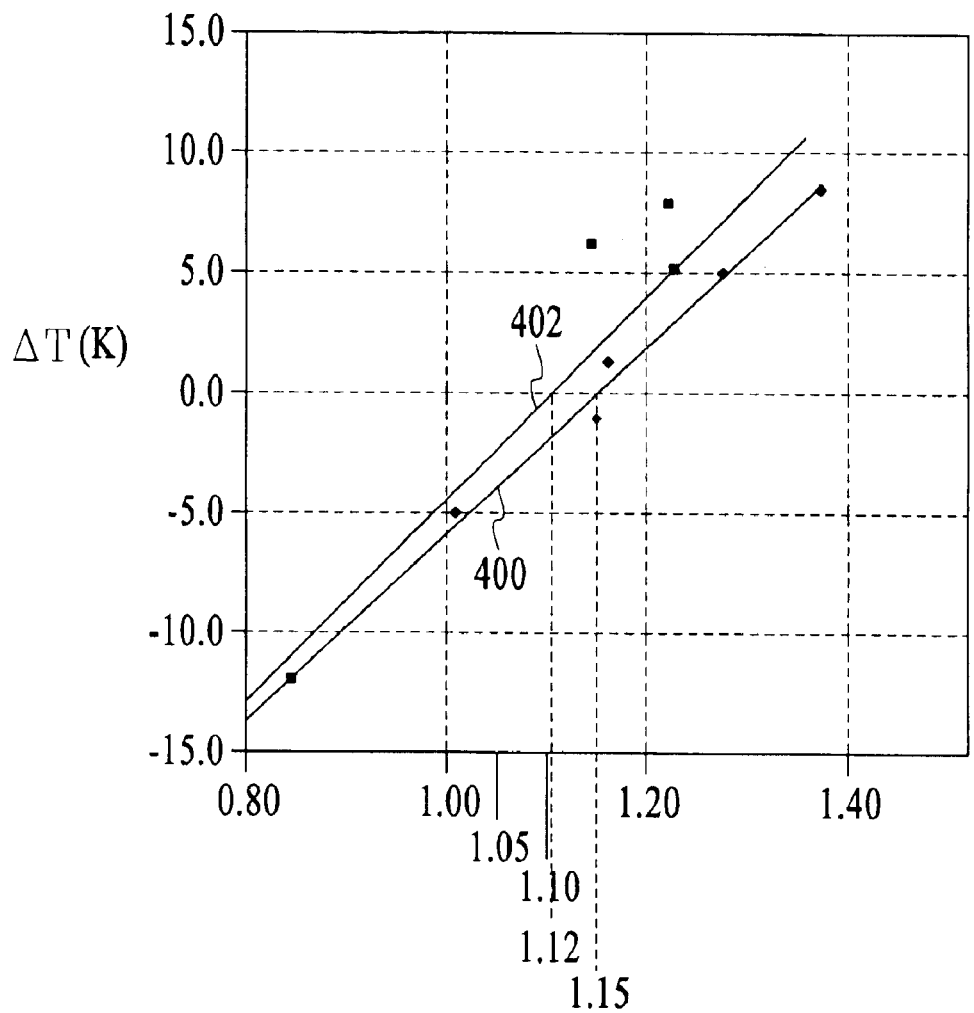
FIG. 3 is a graph of the range in temperatures measured across the surfaces of thermally processed substrates for increasing relative heating rates of the support rings used to thermally process the substrates.

FIG. 3 shows a graph of the substrate temperature range (ΔT) for increasing relative heating rate ($R_{rs}=R_{ring}/R_{substrate}$), which was graphed using the data from Table 1 above. The data was plotted for two separate data sets. The first data set, represented by line 400, included support rings 102 having similar radial mass distributions, that is with the mass distributed relatively evenly to both the band 105 and lip 106 of the support ring. The second data set, represented by line 402, included support rings 102 having less uniform radial distributions, with mass distributed only to the band 105. This graph shows that a range in temperatures across the substrate that is closest to zero is achieved for a relative heating rate ($R_{rs}$) in the range of from 1.12 to about 1.15, such as about 1.14. Accordingly, support rings 202 can be devised to thermally match substrates 104 and reduce temperature gradients in the substrates 104 by selecting rings 102 having a relative heating rate within this range.

Although exemplary embodiments of the present invention are shown and described, those of ordinary skill in the art may devise other embodiments which incorporate the present invention, and which are also within the scope of the present invention. For example, other support ring materials other than those specifically mentioned could be used to devise a support ring having a desired relative heating rate. Furthermore, relative or positional terms shown with respect to the exemplary embodiments are interchangeable. Therefore, the appended claims should not be limited to the descriptions of the preferred versions, materials, or spatial arrangements described herein to illustrate the invention.

What is claimed is:

1. A substrate support ring comprising:
   (a) a band comprising an inner perimeter to at least partially surround a periphery of the substrate, the band comprising a radiation absorption surface; and
   (b) a lip extending radially inwardly from the inner perimeter of the band to support the substrate,
   wherein the band and lip comprise a sintered composition of silicon carbide and nitrogen, and
   wherein the radiation absorption surface comprises a layer of oxidized silicon carbide.

2. A ring according to claim 1 wherein the sintered composition comprises a nitrogen content that is sufficiently high such that the sintered composition is substantially opaque to incident radiation.

3. A ring according to claim 1 wherein the band and lip comprise a combined thermal mass $T_m$, and wherein the radiation absorption surface comprises an absorptivity A and a surface area $S_a$, such that the ratio $(A \times S_a)/T_m$ is from about $4 \times 10^{-5}$ m$^2$K/J to about $9 \times 10^{-4}$ m$^2$K/J.

4. A ring according to claim 3 wherein the radiation absorption surface comprises an absorptivity A and a surface area $S_a$, such that the ratio $(A \times S_a)/T_m$ is from about $5.2 \times 10^{-4}$ K/J to about $7.6 \times 10^{-4}$ K/J.

5. A ring according to claim 1 wherein the radiation absorption surface comprises an absorptivity of from about 0.1 to about 1.0, and a surface area of from about $2 \times 10^{-3}$ m$^2$ to about $3 \times 10^{-2}$ m$^2$.

6. A ring according to claim 1 wherein the band and lip comprises a heat capacity of from about 900 J/Kg/K to about 1300 J/Kg/K, and wherein the thermal mass is from about 2 J/K to about 750 J/K.

7. A process chamber comprising:
   (i) a process gas supply and exhaust;
   (ii) a substrate support ring according to claim 1; and
   (iii) a radiation source to direct radiation onto the substrate and radiation absorption surface of the ring; and
   (iv) an exhaust.

8. A substrate support ring comprising:
   (a) a band comprising an inner perimeter to at least partially surround a periphery of the substrate, the band comprising a radiation absorption surface; and
   (b) a lip extending radially inwardly from the inner perimeter of the band,
   wherein the band and lip comprise a combined thermal mass $T_m$, and
   wherein the radiation absorption surface comprises an absorptivity A and a surface area $S_a$, such that the ratio $(A \times S_a)/T_m$ is from about $4 \times 10^{-5}$ m$^2$K/J to about $9 \times 10^{-4}$ m$^2$K/J.

9. A ring according to claim 8 wherein the radiation absorption surface comprises an absorptivity A and a surface area $S_a$, such that the ratio $(A \times S_a)/T_m$ is from about $5.2 \times 10^{-4}$ K/J to about $7.6 \times 10^{-4}$ K/J.

10. A ring according to claim 8 wherein the radiation absorption surface comprises an absorptivity of from about 0.1 to about 1.0, and a surface area of from about $2 \times 10^{-3}$ m$^2$ to about $3 \times 10^{-2}$ m$^2$.

11. A ring according to claim 8 wherein the band and lip comprise silicon carbide, and wherein the radiation absorption surface of the band comprises an oxidized layer of the silicon carbide.

12. A ring according to claim 11 wherein the band and lip comprise a sintered composition of silicon carbide and nitrogen.

13. A method of fabricating a substrate support ring to support a substrate in a process chamber, the substrate comprising a thermal mass $T_{ms}$, and a top surface having an absorptivity $A_s$, and a surface area $S_{as}$, wherein the substrate comprises a substrate heating rate value comprising $(A_s \times S_{as})/T_{ms}$, the fabrication method comprising:

(a) forming a band comprising an inner perimeter to at least partially surround a periphery of the substrate, and forming a lip extending radially inwardly from the inner perimeter of the band, the band and lip comprising a combined thermal mass $T_{mr}$ and having a support ring heating rate value comprising $(A_r \times S_{ar})/T_{mr}$; and (b) forming a radiation absorption surface on the band, the radiation absorption surface comprising an absorptivity $A_r$ and surface area $S_{ar}$, such that the ratio of the support ring heating value to the substrate heating rate value is within a predetermined range.

14. A method according to claim 13 wherein the predetermined range is from about 1.05 to about 1.3.

15. A method according to claim 13 wherein the heating rate value of the support ring is within from about 5% to about 30% of the substrate heating rate value.

16. A method according to claim 13 wherein the support ring heating rate value is from about $4 \times 10^{-5}$ m²K/J to about $9 \times 10^{-4}$ m² K/J.

17. A method according to claim 16 wherein the support ring heating rate value is from about $5.2 \times 10^{-4}$ K/J to about $7.6 \times 10^{-4}$ K/J.

18. A method according to claim 13 wherein (a) comprises forming the band and lip from silicon carbide, and wherein (b) comprises forming a radiation absorption surface of the band that comprises an oxidized layer of the silicon carbide.

19. A process chamber comprising:

(i) a process gas supply and exhaust;

(ii) a substrate support ring according to claim 8; and (iii) a radiation source to direct radiation onto the substrate and radiation absorption surface of the ring; and (iv) an exhaust.

20. A substrate support ring comprising:

(a) a band comprising an inner perimeter to at least partially surround a periphery of the substrate, the band comprising a radiation absorption surface, wherein the radiation absorption surface comprises (i) an absorptivity of from about 0.1 to about 1.0, and (ii) a surface area of from about $2 \times 10^{-3}$ m² to about $3 \times 10^{-2}$ m²; and (b) a lip extending radially inwardly from the inner perimeter of the band to support the substrate, wherein the band and lip comprise silicon carbide, and wherein the radiation absorption surface comprises a layer of oxidized silicon carbide.

21. A ring according to claim 20 wherein the band and lip comprise a sintered composition of silicon carbide and nitrogen having a nitrogen content that is sufficiently high such that the sintered composition is substantially opaque to incident radiation.

22. A ring according to claim 20 wherein the band and lip comprise a combined thermal mass $T_m$, and wherein the radiation absorption surface comprises an absorptivity A and a surface area $S_a$, such that the ratio $(A \times S_a)/T_m$ is from about $4 \times 10^{-5}$ m²K/J to about $9 \times 10^{-4}$ m²K/J.

23. A substrate support ring comprising:

(a) a band comprising an inner perimeter to at least partially surround a periphery of the substrate, the band comprising a radiation absorption surface; and (b) a lip extending radially inwardly from the inner perimeter of the band to support the substrate, wherein the band and lip comprise silicon carbide, and wherein the radiation absorption surface comprises a layer of oxidized silicon carbide, and wherein the band and lip furthermore comprise (i) a heat capacity of from about 900 J/Kg/K to about 1300 J/Kg/K, and (iii) a combined thermal mass of from about 2 J/K to about 750 J/K.

24. A ring according to claim 23 wherein the band and lip comprise a sintered composition of silicon carbide and nitrogen having a nitrogen content that is sufficiently high such that the sintered composition is substantially opaque to incident radiation.

25. A ring according to claim 23 wherein the band and lip comprise a combined thermal mass $T_m$, and wherein the radiation absorption surface comprises an absorptivity A and a surface area $S_a$, such that the ratio $(A \times S_a)/T_m$ is from about $4 \times 10^{-5}$ m²K/J to about $9 \times 10^{-4}$ m²K/J.

* * * * *